United States Patent
Van Brocklin et al.

(10) Patent No.: US 8,513,833 B2
(45) Date of Patent: Aug. 20, 2013

(54) CIRCUIT LIMITING AN ABSOLUTE VOLTAGE DIFFERENCE BETWEEN ELECTRICAL PATHS OF PHOTOVOLTAIC DIES

(75) Inventors: Andrew L. Van Brocklin, Corvallis, OR (US); Stephan R. Clark, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 451 days.

(21) Appl. No.: 12/819,224

(22) Filed: Jun. 20, 2010

(65) Prior Publication Data

US 2011/0308561 A1    Dec. 22, 2011

(51) Int. Cl.
*H02J 1/10*            (2006.01)
(52) U.S. Cl.
USPC ............................... 307/75; 136/244; 307/65
(58) Field of Classification Search
USPC ................................ 307/75, 65, 66; 136/244
See application file for complete search history.

(56) References Cited

U.S. PATENT DOCUMENTS

| | | | |
|---|---|---|---|
| 6,689,949 B2 | 2/2004 | Ortabasi | |
| 7,095,050 B2 | 8/2006 | Wanlass et al. | |
| 2007/0277869 A1 | 12/2007 | Shan et al. | |
| 2009/0283129 A1* | 11/2009 | Foss | 136/244 |
| 2010/0000593 A1 | 1/2010 | Mastromatteo | |
| 2010/0116317 A1* | 5/2010 | Ma | 136/245 |
| 2010/0200043 A1* | 8/2010 | Lombardo et al. | 136/244 |

FOREIGN PATENT DOCUMENTS

| | | |
|---|---|---|
| DE | 102006062018 A1 | 7/2008 |
| WO | 2009032052 A2 | 3/2009 |

* cited by examiner

*Primary Examiner* — Rexford Barnie
*Assistant Examiner* — Haihui Zhang (57) ABSTRACT

A first electrical path has a terminal, and a second electrical path has a terminal. First photovoltaic (PV) dies are electrically connected within the first electrical path. Each first PV die is adapted to convert light having a first wavelength range to electrical energy. Second PV dies are electrically connected within the second electrical path. Each second PV die is adapted to convert light having a second wavelength range different than the first wavelength range to electrical energy. A circuit is electrically connected between the terminals of the first and the second electrical paths to limit an absolute voltage difference between the terminals to no greater than a threshold voltage.

14 Claims, 6 Drawing Sheets

CIRCUIT LIMITING AN ABSOLUTE VOLTAGE DIFFERENCE BETWEEN ELECTRICAL PATHS OF PHOTOVOLTAIC DIES

GOVERNMENTAL RIGHTS IN THE INVENTION

The invention that is the subject of this patent application was made with Government support under Subcontract No. CW135971, under Prime Contract No. HR0011-07-9-0005, through the Defense Advanced Research Projects Agency (DARPA). The Government has certain rights in this invention.

BACKGROUND

Traditional approaches to generate electricity have focused on using fossil fuels, such as coal, oil, and natural gas. More recently, for environmental and other reasons, attention has focused on renewable energy sources. Such renewable energy sources include wind, geothermal, and solar. With respect to solar energy in particular, a solar cell is used to convert energy from the sun into electrical energy.

DETAILED DESCRIPTION

As noted in the background section, a solar cell is used to convert energy from the sun into electrical energy. While solar energy is gaining traction as an energy source from which to generate electricity, it has so far failed to achieve widespread adoption on the same order that fossil fuel energy sources have. One reason why this is the case is because generating electrical energy from solar energy remains expensive, in part because of the inefficiencies and the manufacturing cost of solar cells.

A solar cell includes one or more photovoltaic (PV) dies. A PV die can be considered as the smallest PV unit that does not have to be electrically connected to other PV units on the same or different solar cell by external conductors, such as by conductive traces formed on a solar cell itself, by wires connecting multiple solar cells together, and so on. A typical solar cell includes more than one PV die, where these PV dies are electrically connected to one another in a given series and/or parallel topology.

One type of solar cell includes two different types of PV dies. The first type of PV die optimally converts light having a first wavelength range to electrical energy, and the second type of PV die optimally converts light having a second wavelength range to electrical energy. The second wavelength range for which the second type of PV die optimally converts light to electrical energy is different than the first wavelength range for which the first type of PV die optically converts light to electrical energy. This type of solar cell is usually more efficient than solar cells having just one type of PV die. This is because a given PV die type typically can optimally convert light to electrical energy within a specific wavelength range. Therefore, having a solar cell with multiple types of PV dies ensures that more wavelengths of light are optimally converted to electrical energy.

A difficulty with this type of solar cell, however, is electrically connecting the different types of PV dies to generate electrical energy at a desired voltage. Conventionally, the different types of PV dies are connected to one another in various series and/or parallel topologies within a single electrical path. Having just a single electrical path means that currents flowing through and voltages over the PV dies have to be matched to at least some degree. Such matching, however, can result in the PV dies non-optimally converting sunlight into electrical energy, which reduces the efficiency of the solar cell.

By comparison, embodiments of the disclosure separate the different types of PV dies into different electrical paths. PV dies of the first type are electrically connected to one another within a first electrical path, and PV dies of the second type are electrically connected to one another within a second electrical path. A circuit is electrically connected between the electrical paths to limit the absolute voltage difference between the paths to no greater than a threshold, which various regulations may specify.

Therefore, embodiments of the disclosure do not have to match currents and voltages between disparate types of PV dies. The currents through the first type of PV dies do not have to be matched to and are independent of the currents through the second type of PV dies. Likewise, the voltages over the first type of PV dies do not have to be matched to the voltages over the second type of PV dies. As such, the PV dies can more optimally convert sunlight into electrical energy, increasing the efficiency of the solar cell.

Figure 1:
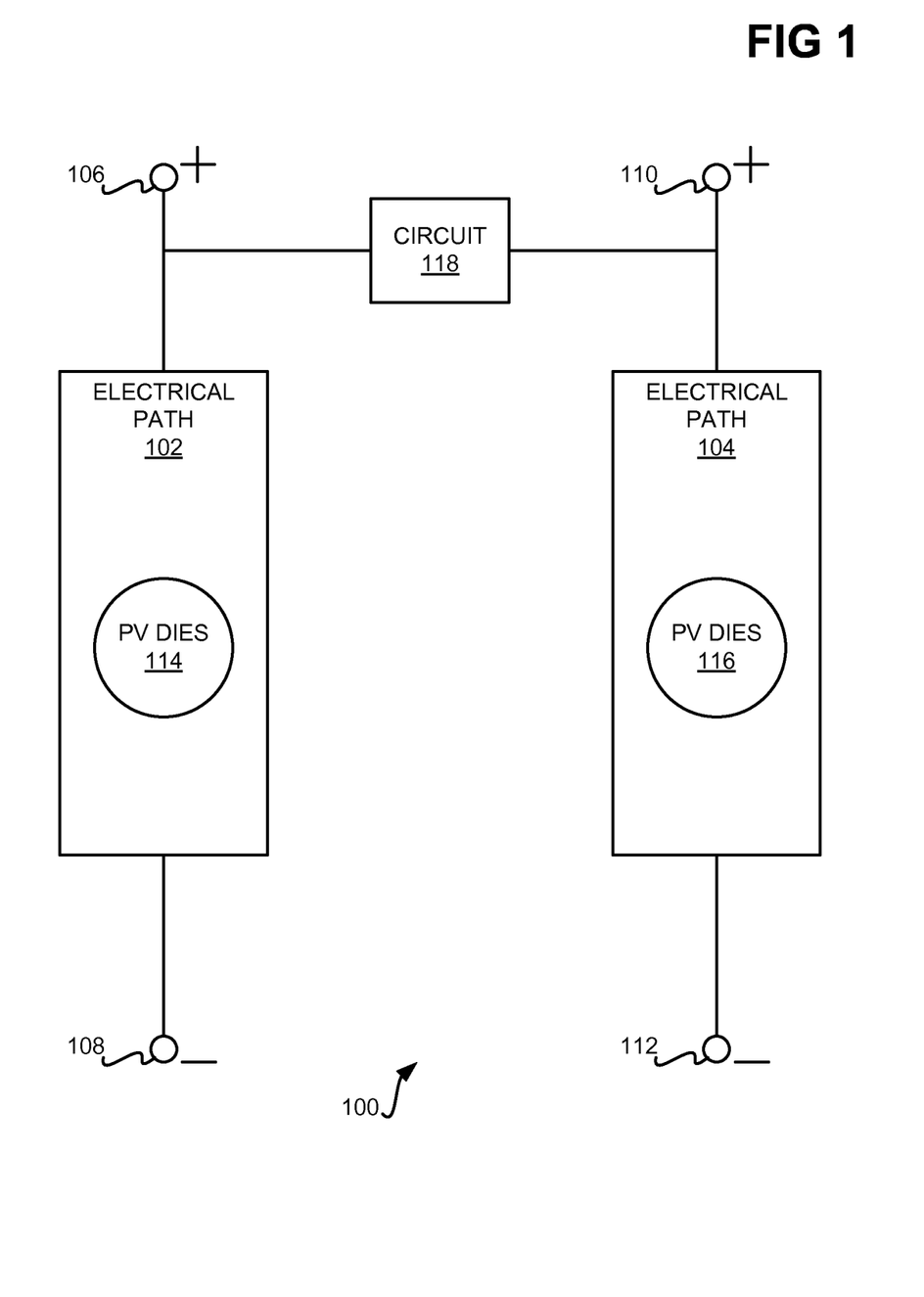
FIG. 1 is a diagram of a system including two electrical paths of photovoltaic (PV) dies interconnected by a circuit, according to an embodiment of the disclosure.

FIG. 1 shows a system 100, according to an embodiment of the disclosure. The system 100 includes two electrical paths 102 and 104. The electrical path 102 has a positive terminal 106 and a negative terminal 108, and the electrical path 104 has a positive terminal 110 and a negative terminal 112. The electrical path 102 includes a number of photovoltaic (PV) dies 114 electrically connected to one another, and the electrical path 104 includes a number of PV dies 116 electrically connected to one another. A circuit 118 is electrically connected between the terminals 106 and 110 of the electrical paths 102 and 104.

The PV dies 114 are each adapted to convert light, such as sunlight, having a first wavelength range to electrical energy. The PV dies 116 are each adapted to convert light, such as sunlight, having a second wavelength range different than the first wavelength range to electrical energy, where the second wavelength range can overlap the first wavelength range to some degree. For instance, the PV dies 114 may be optimized to absorb shorter wavelengths of light, such as the blue-to-red wavelengths within the visible light spectrum, and the PV dies 116 may be optimized to absorb longer wavelengths outside the visible light spectrum. Therefore, in the parlance of solar cells, the PV dies 114 are said to be a mid-energy (mid-E) PV dies having a middle energy gap, and the PV dies 116 are said to be low-E PV dies having a low energy gap.

The PV dies 114 are connected to one another in a desired series and/or parallel topology to optimize conversion of solar energy to electrical energy by the PV dies 114. Likewise, the PV dies 116 are connected to one another in a desired series and/or parallel topology to optimize conversion of solar energy to electrical energy by the PV dies 116. The topology in which the PV dies 114 are connected can be and typically is different than the topology in which the PV dies 116 are connected. That is, the connection topology of the PV dies 114 is independent of the connection topology of the PV dies 116.

It is noted that the PV dies 114 are not electrically connected to the PV dies 116 within the system 100 except at the circuit 118. The electrical path 102 has a current flowing therethrough that is thus independent of, and does not have to be matched to, a current flowing through the electrical path 104. Likewise, the voltages over the PV dies 114 do not have to be matched to the voltages over the PV dies 116.

The circuit 118 limits the absolute voltage difference between the terminals 106 and 110 of the electrical paths 102 and 104 to no greater than a threshold voltage. In one embodiment, this threshold voltage is fifty volts, which is specified by the Underwriters Laboratories (UL) specification UL-1703 for a particular type of PV solar cell where there is an over-surface insulation distance of 1.6 millimeters (mm). Therefore, while the current through the electrical path 102 is completely independent of the current through the electrical path 104, the voltages over the PV dies 114 and 116 are somewhat dependent on one another, insofar as the circuit 118 limits the absolute voltage difference between the terminals 106 and 110 to a threshold voltage. Otherwise, however, the voltages over the PV dies 114 and 116 are independent of one another.

Figure 2:
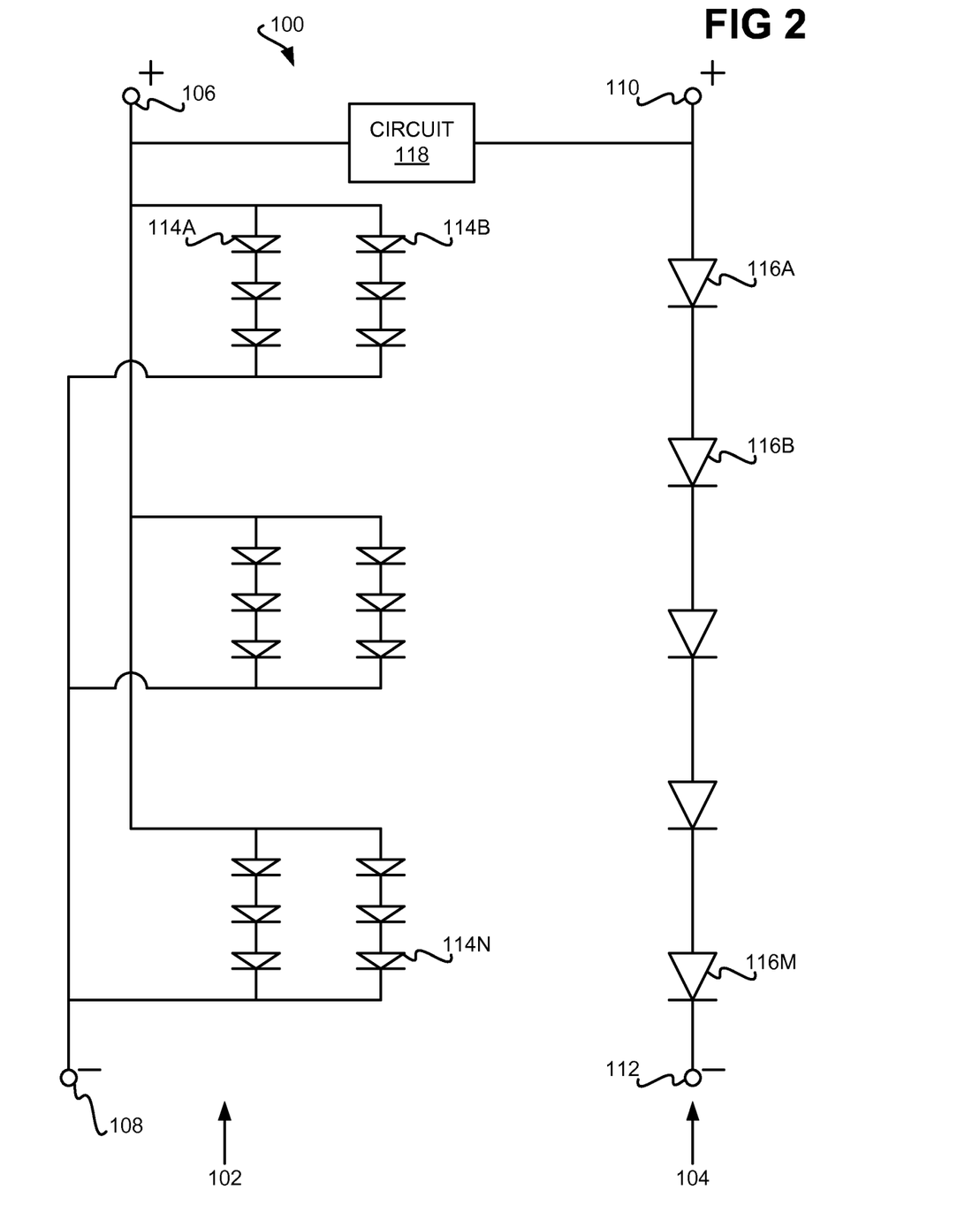
FIG. 2 is a diagram of a representative implementation of the electrical paths of the system of FIG. 1 in detail, according to an embodiment of the disclosure.

FIG. 2 shows specific connection topologies of the PV dies 114 and 116 within the electrical paths 102 and 104 within a representative system 100, according to an embodiment of the disclosure. As before, the electrical path 102 includes the positive terminal 106 and the negative terminal 108, and the electrical path 104 includes the positive terminal 110 and the negative terminal 112. The system 100 includes the circuit 118 as before as well. The PV dies 114 and 116 are represented in FIG. 2 as diodes.

The PV dies 114 of the electrical path 102 includes PV dies 114A, 114B, . . . , 114N, and the PV dies 116 of the electrical path 104 includes PV dies 116A, 116B, . . . , 116M. There are more PV dies 114 than PV dies 116 in FIG. 2. Also in FIG. 2, the PV dies 114 are connected in parallel pairs of series branches, whereas the PV dies 116 are connected in series. FIG. 2 thus illustrates that the PV dies 114 do not have to be equal in number to the PV dies 116, and that the PV dies 114 can be connected to one another in accordance with a different series and/or parallel topology than the PV dies 116 are.

Figure 3:
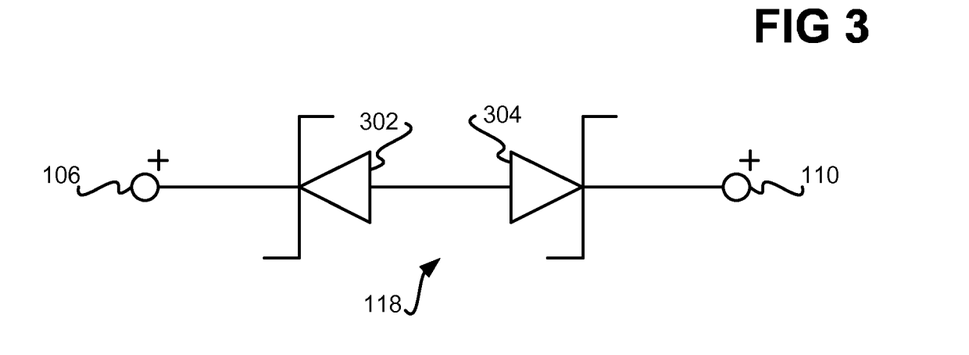
FIG. 3 is a diagram of an implementation of the circuit of the system of FIG. 1 in detail, according to an embodiment of the disclosure.
Figure 4:
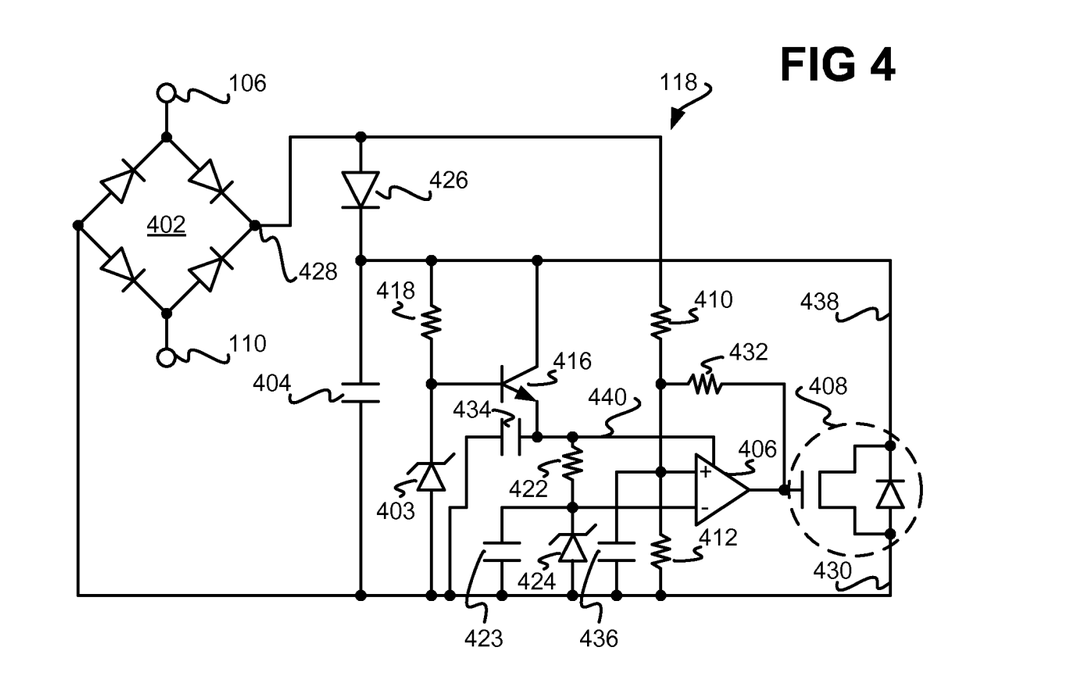
FIG. 4 is a diagram of an implementation of the circuit of the system of FIG. 1 in detail, according to another embodiment of the disclosure.

FIGS. 3 and 4 show different implementations of the circuit 118, according to varying embodiments of the disclosure. In FIG. 3, the circuit 118 includes a pair of avalanche breakdown diodes 302 and 304 connected in series to one another in opposing polarity, between the positive terminals 106 and 110. Each avalanche breakdown diode 302 and 304 is rated at the threshold voltage. When the voltage at the terminal 106 is greater than the voltage at the terminal 110 by more than the threshold voltage, the avalanche breakdown diode 304 conducts in its forward direction and the avalanche breakdown diode 302 conducts in the reverse, breakdown direction, such that the diodes 302 and 304 limit the voltage difference to the threshold voltage. When the voltage at the terminal 110 is greater than the voltage at the terminal 106 by more than the threshold voltage, the avalanche breakdown diode 302 conducts in its forward direction and the avalanche breakdown diode 304 conducts in the reverse, breakdown direction, also such that the diodes 302 and 304 limit the voltage difference to the threshold voltage.

In FIG. 4, it is noted that connections between electrical conductors (i.e., lines) are shown as darkened, or filled-in, circles. Therefore, where there is no such circle at any given intersection of two lines in FIG. 4, the conductors represented by these lines are not connected to one another. By comparison, where there is a circle at any given intersection of two lines in FIG. 4, the conductors represented by these lines are connected to one another.

The circuit 118 includes a rectifier 402 connected between the terminals 106 and 110. The rectifier 402 is part of a power supply within the circuit 118 that is made up of the capacitor 404, the transistor 416, the resistor 418, and the diodes 403 and 426, in addition to the rectifier 402. This power supply powers a comparator 406 and a reference sub-circuit. The reference sub-circuit is made up of a resistor 422, a capacitor 423, and a zener diode 424, and provides a reference voltage to a negative input of the comparator 406. The resistors 410 and 412 form a voltage divider sub-circuit so that the voltage output by the rectifier 402 at the output 428, where this voltage corresponds to the voltage across the terminals 106 and 110, is properly scaled to a positive input of the comparator 406. The resistor 432 is a hysteresis resistor 432 for the comparator 406, and the comparator 406 has a push-pull output connected to a transistor 408. The transistor 408 is a metal-oxide-semiconductor field-effect (MOSFET) transistor, and is internally made up of a transistor part and a body diode part, as depicted in FIG. 4.

More specifically, the rectifier 402 is made up of four diodes organized in a bridge circuit, as shown in FIG. 4. The rectifier 402 converts alternating current (AC) to direct current (DC). The alternating current in this case is that the voltage at the positive terminal 106 may be greater than the voltage at the terminal 110 at some times, and at other times the voltage at the terminal 106 may be lower than the voltage at the terminal 110. Through the diode 426, the voltage output by the rectifier 402 charges the capacitor 404, which is an energy storage device to store electrical energy from the rectifier 402 to power the circuit 118 while the circuit 118 is in operation and is shorting the terminals 106 and 110 together through the transistor 408.

The capacitor 404 powers the comparator 406 via the transistor 416. The transistor 416 is connected as an emitter follower, where the resistor 418 and the zener diode 420 are connected in a branch that is in parallel with the capacitor 404 to controls the voltage delivered to the comparator 406 and the voltage reference sub-circuit. The transistor 416 has an output that is connected to a capacitor 434 to decouple the voltage provided to the comparator 406. The comparator 406 compares the voltage at the output 428 of the rectifier 402 on the positive input of the comparator 406, via the voltage divider sub-circuit formed by the resistors 410 and 412, with the voltage of the reference sub-circuit made up of the resistor 422, the capacitor 423, and the diode 424 on the negative input of the comparator 406. The capacitor 436 filters out any sudden voltage transients between the terminals 106 and 106. The resistor 432, along with the impedance represented by the resistors 410 and 412 in parallel, provides hysteresis within the circuit 118.

During operation, the rectifier 402 charges the capacitor 404, ensuring that the circuit 118 will have power for a certain time period, regardless of any changes in voltage between the terminals 106 and 110. The voltage over the capacitor 434 is regulated by the resistor 418 and the zener diode 403 minus the voltage drop of the transistor 416. The transistor 416 in conjunction with the capacitor 434 provides a substantially constant and regulated voltage to the comparator 406. If the voltage at the positive input of the comparator 406 is greater than the voltage at the negative input of the comparator 406 by more than a given threshold, the output of the comparator 406 is effectively connected to the emitter (i.e., output) of the transistor 416, which is the power supply voltage 440. By comparison, if the voltage at the positive input is less than the voltage at the negative input by more than a given threshold, the output of the comparator 406 is effectively connected to point 430.

As noted above, the negative input of the comparator 406 is connected to a reference sub-circuit made up of the resistor 422, the capacitor 423, and the diode 424 so that a precise and steady reference voltage is provided at the negative voltage. By comparison, the positive input of the comparator 406 is proportional to the voltage between the terminals 106 and 110, as rectified by the rectifier 402. As such, when the voltage between the terminals 106 and 110 rises above a certain threshold, the voltage at the positive input of the comparator 406 becomes greater than the voltage at the negative input of the comparator 406 by more than the given threshold. The output of the comparator 406 in this case charges the gate of the transistor 408, and thus causing the points 428 and 430 to short together.

At the time of shorting, the voltage between the terminals 106 and 110 is limited to the voltage drop across two diodes within the rectifier 402 plus the voltage drop across the transistor 430. In this way, the voltage between the terminals 106 and 110 is limited to a value below that of the threshold voltage. As noted above, the threshold voltage may be fifty volts, as specified by UL specification UL-1703, in the case where there is an over-surface insulation distance of 1.6 mm. Eventually the voltage over the capacitor 404 will decrease to the level where the charge on the gate on the transistor 408 is reduced to a level where there is no short between the points 438 and 430. At this time, the voltage between the terminals 106 and 110 and thus over the capacitor 404 begins to rise again, and the described cycle is repeated. The length of the cycle is dictated primarily by the time constant of the capacitor 404 and the current drawn from the capacitor 404 to power the circuit 118.

Figure 5:
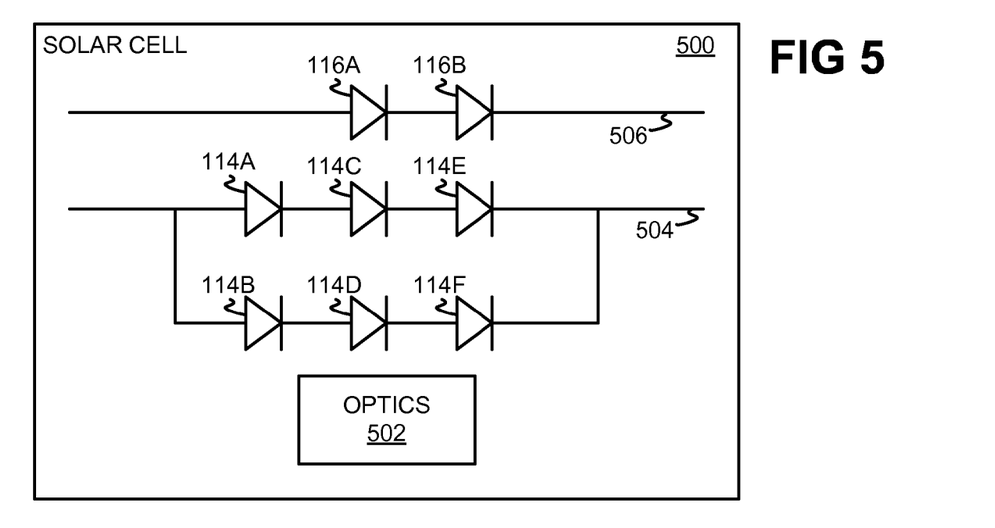
FIG. 5 is a diagram of a representative solar cell including a number of the PV dies of FIG. 1, according to an embodiment of the disclosure.

FIG. 5 shows a representative solar cell 500, according to an embodiment of the disclosure. The solar cell 500 includes a number of PV dies 114, a number of PV dies 116, and optics 502. There are six PV dies 114A, 114B, 114C, 114D, 114E, and 114F connected in a branch circuit 504, and two PV dies 116A and 116B connected in another branch circuit 506 in the example of FIG. 5. The PV dies 114A, 114C, and 114E are connected in series with one another in FIG. 5, as are the PV dies 114B, 114D, and 114F, where the former PV dies 114 are connected in parallel in relation to the latter PV dies 114, as depicted in FIG. 5. The PV dies 116A and 116B are connected in series with one another in FIG. 5.

As noted above, a PV die is the smallest PV unit that does not have to be electrically connected to other PV units on the same or different solar cell by external conductors, such as by conductive traces formed on a solar cell itself. As such, in FIG. 5, the PV dies 116 are disposed in relation to each other within the solar cell 500 in such a way that they are connected in series without the use of external conductors like conductive traces. Similarly, the PV dies 114 are disposed in relation to each another within the solar cell 500 in such a way that they are connected as shown in FIG. 5 without the use of such external conductors.

The optics 502 may include plastic, glass, and/or metal optics that are reflective and/or transmissive, and that are shaped to appropriately direct sunlight onto the PV dies 114 and 116. Such reflective and/or transmissive optics may be dichroic in nature, in that they transmit certain wavelengths and reflect other wavelengths. For example, the optics 502 may include a parabolic dichroic plastic sheet and a parabolic reflective plastic sheet. The parabolic dichroic plastic sheet directs a particular wavelength range of sunlight onto the PV dies 114, and transmits other wavelengths of the sunlight to the parabolic reflective plastic sheet. The parabolic reflective plastic sheet directs these other wavelengths of sunlight onto the PV dies 116.

Figure 6:
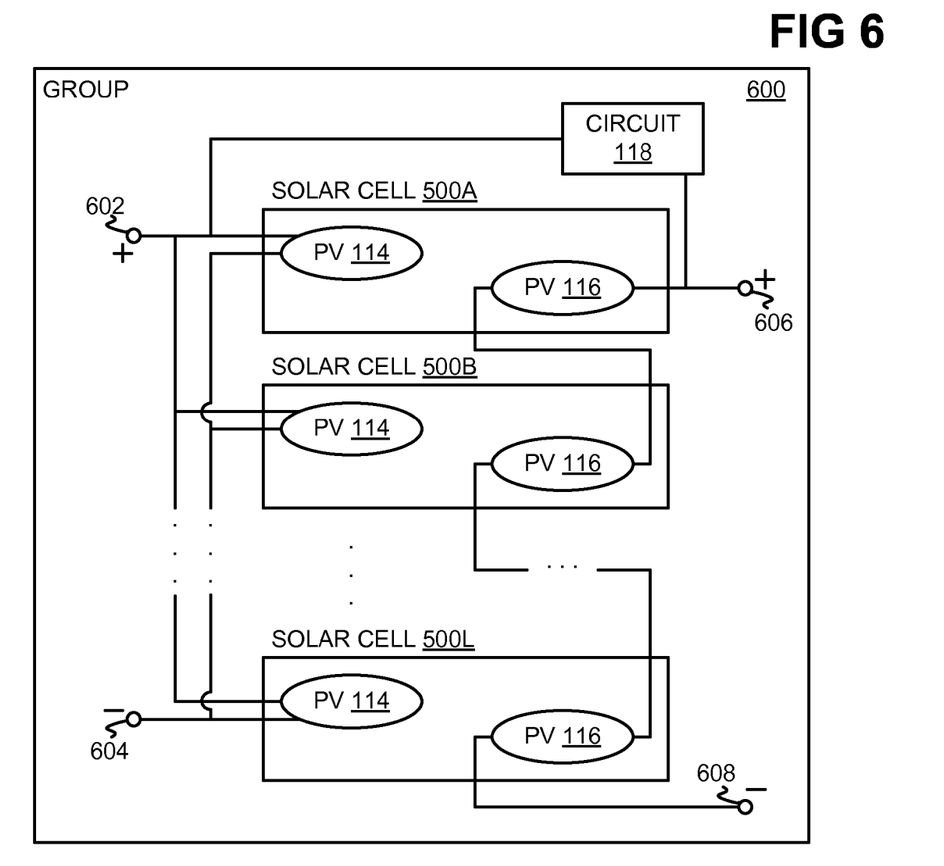
FIG. 6 is a diagram of a representative group of solar cells of FIG. 5, according to an embodiment of the disclosure.

FIG. 6 shows a representative group 600 of solar cells 500, according to an embodiment of the disclosure. The group 600 includes solar cells 500A, 500B, . . . , 500L. The PV dies 114 of each solar cell 500 are connected in parallel with one another between a positive terminal 602 and a negative terminal 604 of the group 600. The PV dies 116 of each solar cell 500 are connected in series with one another between a positive terminal 606 and a negative terminal 608 of the group 600.

An instance of the circuit 118 is connected between the positive terminals 602 and 606 of the group 600. As such, the positive terminals 602 and 606 correspond to the positive terminals 106 and 110 of FIG. 1. Where the system 100 includes a number of such groups 600 of solar cells 500, there is thus a circuit 118 for the solar cells 500 of each group 600. The purpose of FIGS. 5 and 6, therefore, is to show how PV dies 114 and 116 can be organized over a number of solar cells 500 and over one or more groups 600 of solar cells 500.

However, there may be further levels of granularity of the PV dies 114 and 116 between that represented by the solar cell 500 and that represented by the group 600. For example, a number of solar cells 500 may be electrically and mechanically connected together within an array of solar cells 500, such as in a non-weatherproof manner. A number of these arrays may then be electrically and mechanically connected together within a group 600 in a weatherproof enclosure, where the group 600 may be referred to as a module, and where the module includes the circuit 118 as depicted in FIG. 6.

Figure 7:
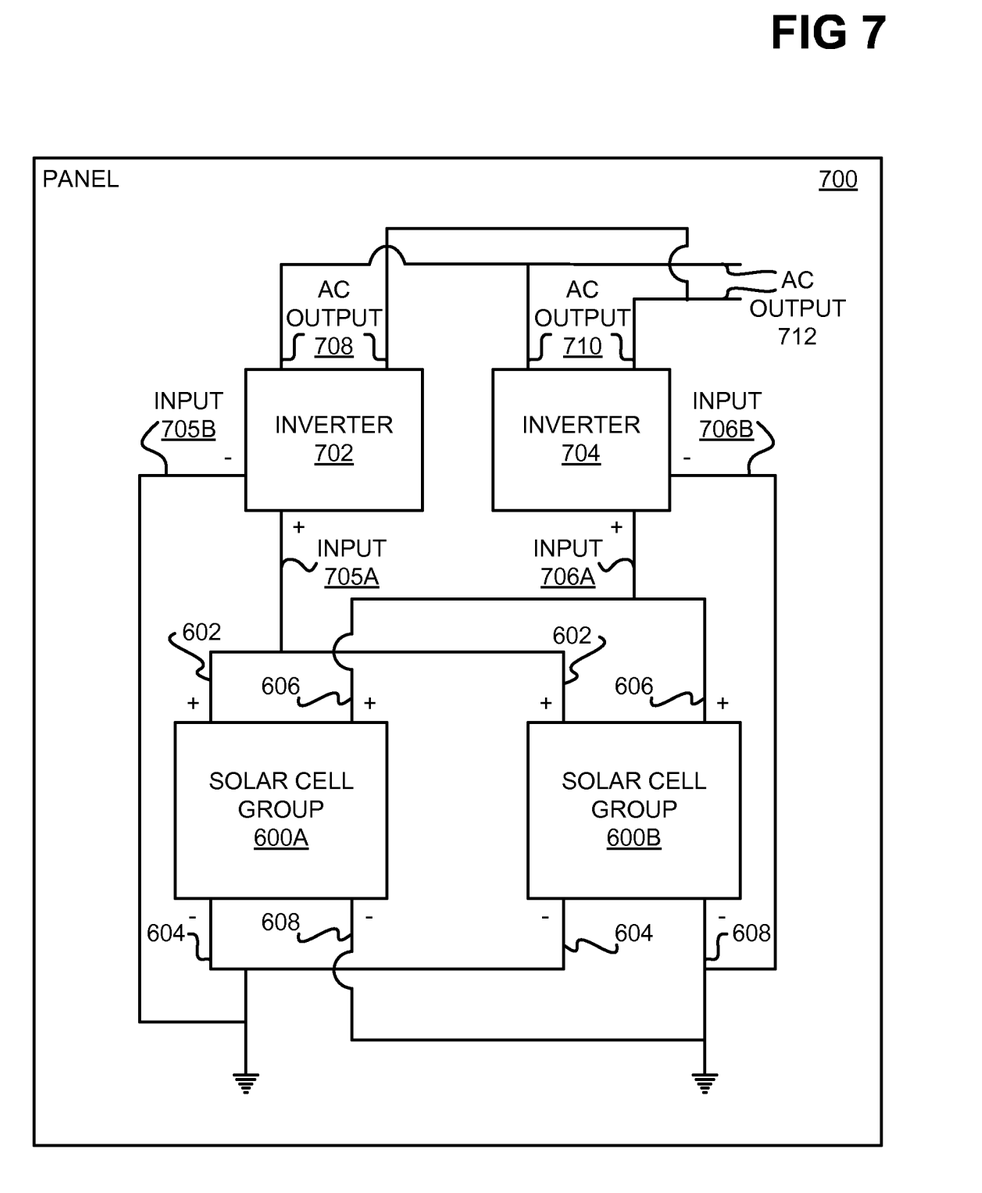
FIG. 7 is a diagram of a representative solar panel of groups of FIG. 6, according to an embodiment of the disclosure.

FIG. 7 shows a representative solar panel 700, according to an embodiment of the disclosure. The panel 700 includes a number of solar cell groups 600, such as two solar cell groups 600A and 600B in the specific example of FIG. 7. The panel 700 further includes an inverter 702 for the PV dies 114 of the groups 600, and an inverter 704 for the PV dies 116 of the groups 600.

The positive terminals 602 of the groups 600 are connected to one another and to a positive input terminal 705A of the inverter 702. The negative terminals 604 of the groups 600 are connected to one another and to a negative input terminal 705B of the inverter 702, as well as to an earth ground. Thus, the PV dies 114 of the solar cells 500 of the groups 600 are connected to the inverter 702. The positive terminals 606 of the groups 600 are connected to one another and to a positive input terminal 706A of the inverter 704. The negative terminals 608 of the groups 600 are connected to one another and to a negative input terminal 706B of the inverter 704, as well as to an earth ground. Thus, the PV dies 116 of the solar cells 500 of the groups 600 are connected to the inverter 704.

The inverters 702 and 704 generate a desired voltage from the power provided by the PV dies 114 and 116, respectively, of the solar cells 500 within the groups 600. As such, FIG. 7 differs from a conventional solar panel. Conventionally, there may be one inverter that generates a desired alternating current (AC) voltage from the power provided by the PV dies 114 and 116, which are conventionally connected together in a single electrical path as noted above. By comparison, in FIG. 7, the inverter 702 generates the desired AC voltage from the power provided by the PV dies 114 connected in a first electrical path, and the inverter 704 generates the desired AC voltage from the power provided by the PV dies 116 connected in a second electrical path, as noted above in relation to FIG. 1.

The inverter 702 provides the desired AC voltage at the AC output 708, and the inverter 704 provides the desired AC voltage at the AC output 710. As depicted in FIG. 7, the AC outputs 708 and 710 are directly electrically connected together to form an AC output of the panel 700 itself. Therefore, the output of the solar panel 700 is no different than the output of a conventional solar panel, in which there is an AC output at which the desired AC voltage is provided, even though the solar panel 700 uses two inverters 702 and 704 instead of just one inverter.

The purpose of FIG. 7 is thus two-fold. First, FIG. 7 shows how a number of solar cell groups 600 can be electrically connected together, as a further abstraction in the level of granularity of the PV dies 114 and 116. Second, FIG. 7 shows how ultimately the two electrical paths 102 and 104 of FIG. 1 are employed to generate power at a desired voltage. Instead of combining the PV dies 114 and 116 within a single electrical path that is then connected to a single inverter, the embodiment of FIG. 7 maintains separation of the PV dies 114 and 116 within the electrical paths 102 and 104 of FIG. 1.

That is, the PV dies 114 are connected to the inverter 702, and the PV dies 116 are connected to the inverter 704. The electrical path 102 of the PV dies 114 is not connected to the electrical path 104 of the PV dies 114, except at the circuit 118. Just after the desired voltage has been output by each of the inverters 702 and 704 is there a connecting together of the power generated by the PV dies 114 within the electrical path 102 with the power generated by the PV dies 116 within the electrical path 104.

Connecting the PV dies 114 within an electrical path 102 separate from the electrical path 104 of the PV dies 116 permits the operating voltage and/or current to be optimized for each type of PV die so that each type of PV die provides the maximum amount of electrical power. By comparison, connecting PV dies of different types within the same electrical path, as in the prior art, limits the ability to optimize the operating voltage and/or current for either type of PV die. As such, neither type of PV die provides the maximum amount of electrical power.

Figure 8:
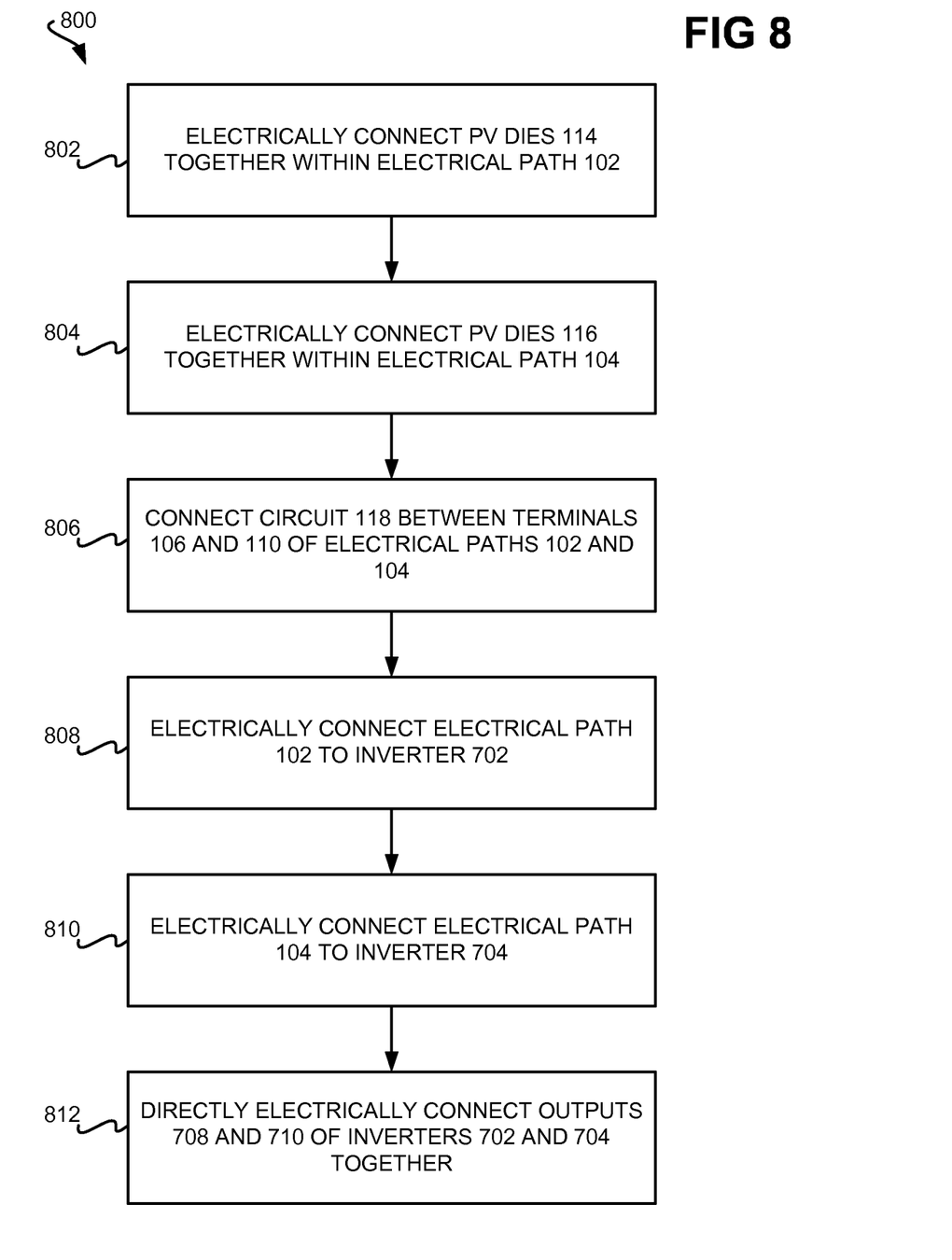
FIG. 8 is a flowchart of a rudimentary method of manufacture, according to an embodiment of the disclosure.

In conclusion, FIG. 8 shows a rudimentary method 800 of manufacture, according to an embodiment of the disclosure. The PV dies 114 are electrically connected together within the electrical path 102 (802), and likewise the PV dies 116 are electrically connected together within the electrical path 104 (804). The circuit 118 is connected between the terminals 106 and 110 of the electrical paths 102 and 104 (806). The electrical path 102 (i.e., the PV dies 114) are electrically connected to the inverter 702 (808), and the electrical path 104 (i.e., the PV dies 116) are electrically connected to the inverter 704 (810). The AC outputs 708 and 710 of the inverters 702 and 704 are directly electrically connected together (812).

We claim:

1. A system comprising:
   a first electrical path having a terminal;
   a second electrical path having a terminal;
   a plurality of first photovoltaic (PV) dies within the first electrical path, each first PV die adapted to convert light having a first wavelength range to electrical energy;
   a plurality of second PV dies electrically connected within the second electrical path, each second PV die adapted to convert light having a second wavelength range different than the first wavelength range to electrical energy; and,
   a circuit electrically connected between the terminals of the first and the second electrical paths to limit an absolute voltage difference between the terminals to no greater than a threshold voltage;
   wherein each first PV die is a mid-energy (mid-E) PV die having a middle energy gap and is optimized to absorb wavelengths within a visible light spectrum, and each second PV die is a low-energy (low-E) PV die having a low energy gap and is optimized to absorb wavelengths of light outside the visible light spectrum.

2. The system of claim 1, wherein the first PV dies are not electrically connected to the second PV dies within the system except at the circuit.

3. The system of claim 1, wherein the first electrical path has a first current to flow therethrough, the second electrical path has a second current has a second current to flow therethrough, and the first current is independent of the second current.

4. The system of claim 1, wherein a first voltage is over each first PV die, a second voltage is over each second PV die, and the first voltage is not matched to the second voltage within the system.

5. The system of claim 1, wherein the circuit comprises a pair of avalanche breakdown diodes connected in series between the terminals with opposing polarity.

6. The system of claim 1, wherein the circuit comprises:
   a energy storage device to store electrical energy; and,
   a comparator to compare a first voltage at the first output with a second voltage at the second output, and powered by the electrical energy stored by the energy storage device,
   wherein an output of the comparator is to affect the circuit in such a way as to limit the absolute voltage difference between the terminals to no greater than the threshold voltage.

7. The system of claim 1, further comprising:
   a plurality of solar cells, each solar cell comprising one or more of:
     at least one of the first PV dies; and,
     at least one of the second PV dies.

8. The system of claim 7, wherein each solar cell comprises at least one of the first PV dies and at least one of the second PV dies.

9. The system of claim 7, further comprising:
   a plurality of identical circuits including the circuit,
   wherein the solar cells are organized over a plurality of groups, each group including a sub-plurality of the solar cells,
   and wherein the each module includes one of the identical circuits.

10. The system of claim 1, further comprising:
    a first inverter to convert the electrical energy from the first PV dies to a desired voltage at a first output; and,
    a second inverter to convert the electrical energy from the second PV dies to the desired voltage at a second output, wherein the first and the second outputs are directly electrically connected to one another,
and wherein the system is a solar panel including the first and the second inverters.

11. A solar panel comprising:
a first electrical path having a terminal;
a second electrical path having a terminal;
   a plurality of first photovoltaic (PV) dies within the first electrical path, each first PV die adapted to convert light having a first wavelength range to electrical energy;
a plurality of second PV dies electrically connected within the second electrical path, each second PV die adapted to convert light having a second wavelength range different than the first wavelength range to electrical energy;
one or more circuits electrically connected between the terminals of the first and the second electrical paths to limit an absolute voltage difference between the terminals to no greater than a threshold voltage;
a first inverter to convert the electrical energy from the first PV dies to a desired voltage at a first output; and,
a second inverter to convert the electrical energy from the second PV dies to the desired voltage at a second output,
wherein the first and the second outputs are directly electrically connected to one another;
wherein each first PV die is a mid-energy (mid-E) PV die having a middle energy gap and is optimized to absorb wavelengths within a visible light spectrum, and each second PV die is a low-energy (low-E) PV die having a low energy gap and is optimized to absorb wavelengths of light outside the visible light spectrum.

12. The solar panel of claim 11, further comprising:
a plurality of solar cells, each solar cell comprising one or more of:
   at least one of the first PV dies; and,
   at least one of the second PV dies,
wherein the solar cells are organized over a plurality of group, each group including a sub-plurality of the solar cells,
and wherein each module includes one of the circuits.

13. A method comprising:
electrically connecting a plurality of first photovoltaic (PV) dies within a first electrical path, each first PV die electrically connected to at least one other of the first PV dies, each first PV die adapted to convert light having a first wavelength range to electrical energy, the first electrical path having a terminal;
electrically connecting a plurality of second PV dies within a second electrical path, each second PV die adapted to convert light having a second wavelength range different than the first wavelength range to electrical energy, the first electrical path having a terminal; and,
electrically connecting a circuit between the terminals of the first and the second electrical paths, the circuit to limit an absolute voltage difference between the terminals to no greater than a threshold voltage;
wherein each first PV die is a mid-energy (mid-E) PV die having a middle energy gap and is optimized to absorb wavelengths within a visible light spectrum, and each second PV die is a low-energy (low-E) PV die having a low energy gap and is optimized to absorb wavelengths of light outside the visible light spectrum.

14. The method of claim 13, further comprising:
electrically connecting the first electrical path to a first inverter, the first inverter to convert the electrical energy from the first PV dies to a desired voltage at a first output;
electrically connecting the second electrical path to a second inverter, the second inverter to convert the electrical energy from the second PV dies to the desired voltage at a second output; and,
directly electrically connecting the first output and the second outputs together.

* * * * *